(12) United States Patent
Vartuli et al.

(10) Patent No.: US 6,329,741 B1
(45) Date of Patent: Dec. 11, 2001

(54) MULTILAYER CERAMIC PIEZOELECTRIC LAMINATES WITH ZINC OXIDE CONDUCTORS

(75) Inventors: James S. Vartuli, Princeton; David L. Milius, Cranbury, both of NJ (US); Xiaoping Li, Bensalem, PA (US); Wei H. Shih; Wan Y. Shih, both of Rosemont, PA (US); Robert K. Prud'homme, Princeton Junction; Ilhan A. Aksay, Princeton, both of NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/302,758

(22) Filed: Apr. 30, 1999

(51) Int. Cl.$^7$ .................................................. H01L 41/08
(52) U.S. Cl. ........................... 310/363; 310/330; 310/332
(58) Field of Search ................................. 310/330–332, 310/328, 363, 364

(56) References Cited

U.S. PATENT DOCUMENTS

| | | | |
|---|---|---|---|
| 3,676,722 | 7/1972 | Schafft | 310/8.6 |
| 4,812,698 | * 3/1989 | Chida et al. | 310/33 |
| 4,862,029 | 8/1989 | Kasai et al. | 310/311 |
| 5,268,610 | * 12/1993 | Hadimioglu et al. | 310/363 X |
| 5,461,274 | * 10/1995 | Yuji et al. | 310/363 X |
| 5,471,721 | * 12/1995 | Haertling | 310/363 X |
| 5,502,345 | 3/1996 | Kahn et al. | 310/358 |

FOREIGN PATENT DOCUMENTS

| | | | |
|---|---|---|---|
| 58-198069 | * 11/1983 | (JP) | 310/363 |
| 61-216493 | * 9/1986 | (JP) | 310/363 |
| 61-159777 | * 7/1998 | (JP) | 310/363 |

* cited by examiner

Primary Examiner—Mark O. Budd
(74) Attorney, Agent, or Firm—Wolff & Samson

(57) ABSTRACT

A modification of the traditional unimorph flextensional actuator is provided by replacing the metal shim with an electrically conducting oxide. Comprised of lead zirconate titanate and zinc oxide that is co-sintered, the laminate composite obtains large axial displacements while maintaining moderate axial loads. The varistor properties of zinc oxide dictate that the conductance increases several orders of magnitude when a critical electric field is applied. The versatility of the processing over other actuator system facilitates miniaturization, while maintaining comparable performance characteristics. Functional gradients in the material properties are created in the green body by layering thin tape cast sheets. The unique PZT-zinc oxide composite not only controls the piezoelectric gradient, but permits control of the sintering kinetics leading to the processing of either flat or highly domed structures.

14 Claims, 7 Drawing Sheets

Sr L

MULTILAYER CERAMIC PIEZOELECTRIC LAMINATES WITH ZINC OXIDE CONDUCTORS

BACKGROUND OF THE INVENTION

1. Field of the Invention

The present invention relates to a multi-layer piezoelectric laminate including a ceramic conductor and a piezoelectric ceramic, and more particularly to such a multi-layer piezoelectric laminate wherein the ceramic conductor is zinc oxide.

2. Related Art

In actuator systems, researchers try to maximize the generated force and displacement while maintaining a low operating voltage. Multi-layer stacks achieve large forces and keep the operating voltage low, but are limited in displacement. Inherent materials properties of piezoelectrics and electrostrictives have strains that are limited to a few tenths of a percent. Flextensional devices, those that bend like a bimetallic strip, sacrifice the generated force and amplify the strain by utilizing an electromechanical gradient. Low operating voltages with flextensional devices can be obtained by making the actuator thin, but at the expense of decreasing the load bearing capabilities.

The classic example of a flextensional device is the unimorph, shown with two typical support structures in FIG. 1. Consisting of a metal shim bonded to a piezoelectric, displacement occurs due to the electric field inducing a non-uniform lateral stress field. Bonding oppositely poled piezoelectric plates together, commonly called bimorphs, further enhances the bending strain by allowing each half to contribute to the generated moment.

A modified version of the unimorph, called the monomorph, is comprised of one semiconductive piezoelectric ceramic plate. Removal of the difficult and laborious tasks of cutting, polishing, and bonding is a processing advantage of the monomorph over the unimorph. The addition of $(K_{1/2}Bi_{1/2})ZrO_3$ to lead zirconate titanate or barium titanate converts the normally insulating piezoelectric into a semiconductive piezoelectric. Bending occurs due to the non-uniform electric field distribution that arises from the semiconductor-metal interface under an applied voltage.

The Rainbow is another modification of the unimorph. Once again, the bending stress is achieved with a variation in the electromechanical properties across the thickness of the device. Rather than bond dissimilar materials together, one side of the lead oxide based ferroelectric disc is chemically reduced with respect to oxygen. The reduction process converts a portion of the ferroelectric into a ceramic metal composite. A complicated composite structure of lead metal and reduced ferroelectric ceramic is created. Effectively, the ceramic-metal portion replaces the non-piezoelectric in a standard unimorph.

Another variation of the unimorph is made with thin tapes of PZT powder doped with varying amounts of zinc borate. Stacking the undoped PZT tapes with doped tapes creates a gradient in resistivity. During the sintering process, the zinc ion diffuses through the sample to yield a nearly linear variation in zinc borate concentration. Regions in the actuator that are more conductive will not obtain the same extent of poling as the undoped region. Effectively, a variation in the magnitude of poling is obtained.

Efforts in the past to produce devices having strong bonds between the conductor and the piezoelectric, which may allow such devices to be miniaturized, include:

U.S. Pat. No. 3,676,722, outlines the structure for bimorph or monomorph benders. A bimorph bender is comprised of two piezoelectric wafers with a center vane of conductive material and a monomorph is comprised of a piezoelectric bonded to a conductive material bonded to a piezoelectrically inactive material. When a field is applied the piezoelectric will change shape and induce a bending moment. The attachments of each section are done with adhesive or metal solder.

U.S. Pat. No. 4,862,029, describes a similar device as above. The piezoelectric material is doped with $K(Nb, Ta)O_3$ to alter the electrical properties of the piezoelectric. The mixture is pressed into a disc or plate shape and sintered to create a semiconductive piezoelectric. Without this processing step, the piezoelectric will normally be insulating. When electrodes are attached and an electric field is applied, a non-uniform potential is created at the semiconductive-metal interface. This results in non-uniform strain through the ceramic plate inducing a bending stress.

U.S. Pat. No. 5,471,721, describes a modification of the above inventions. One side of a monolithic lead oxide-based piezoelectric plate is chemically reduced with respect to oxygen. This portion of the ceramic is converted into a ceramic-metal composite that ceases to have piezoelectric properties. The chemical reduction has made this plat into a device that behaves as the invention outlined in U.S. Pat. No. 3,676,722.

U.S. Pat. No. 5,502,345, describes an actuator that has one region with lower resistivity in contact with a second region of higher resistivity. There is no seam where the said regions are in contact with each other. The device is similar to the one outlined in U.S. Pat. No. 4,862,029, and rather than doping with $K(Nb, Ta)O_3$, they dope with iron oxide or zinc borate. Doping a lead-oxide based piezoelectric with iron oxide or zinc borate at a concentration of 0.5 to 3-weight % will increase the conductivity of the ceramic. Layering a doped ceramic with an undoped ceramic and subsequent sintering of the laminate yields the desired device. The doped portion is more conductive than the undoped portion. Diffusion of the doping agents across the interface during the sintering step removes any trace of the interface.

The present invention is different from the above mentioned inventions in that the present invention layers a ceramic (zinc oxide) with a piezoelectric ceramic (lead zirconate-titanate or PZT). The two different ceramics are stacked and sintered simultaneously resulting in a laminated monolith. The interface between the zinc oxide and PZT is sharp and remains after sintering. The interface thickness is about 20 microns wide. Silver electrodes are applied to two opposing surfaces parallel to the zinc oxide—PZT interface. An electric field is applied. Upon reaching a field around 50 to 70 V/mm thickness of zinc oxide, the conductivity of the zinc oxide dramatically increases. Essentially, the zinc oxide behaves like shim of metal. However, this device is completely ceramic and needs no post-sintering processing steps to join the piezoelectric to the non-piezoelectric.

None of these prior efforts teach or suggest a multilayer piezoelectric laminate having a piezoelectric ceramic and a ceramic conductor. Further, none teach or suggest the use of zinc oxide for the ceramic conductor.

OBJECTS AND SUMMARY OF THE INVENTION

It is an object of the present invention to provide multi-layer piezoelectric ceramic device having a ceramic conductor.

It is an additional object of the present invention to provide a multi-layer piezoelectric ceramic device wherein the conductor is zinc oxide.

It is even an additional object of the present invention to provide a multi-layer piezoelectric ceramic device having a piezoelectric ceramic and a ceramic conductor with a strong bond therebetween.

It is still even an additional object of the present invention to provide a multi-layer piezoelectric ceramic device having a strong bond between layers which is suitable for miniaturization.

The present invention provides a modification of the traditional unimorph flextensional actuator by replacing the metal shim with an electrically conducting oxide. Comprised of lead zirconate titanate and zinc oxide that is co-sintered, the laminate composite obtains large axial displacements while maintaining moderate axial loads. The varistor properties of zinc oxide dictate that the conductance increases several orders of magnitude when a critical electric field is applied. The versatility of the processing over other actuator system facilitates miniaturization, while maintaining comparable performance characteristics. Functional gradients in the material properties are created in the green body by layering thin tape cast sheets. The unique PZT-zinc oxide composite not only controls the piezoelectric gradient, but permits control of the sintering kinetics leading to the processing of either flat or highly domed structures.

BRIEF DESCRIPTION OF THE DRAWINGS

Other important objects and features of the invention will be apparent from the following Detailed Description of the Invention taken in connection with the accompanying drawings in which.

DETAILED DESCRIPTION OF THE INVENTION

Figure 1:
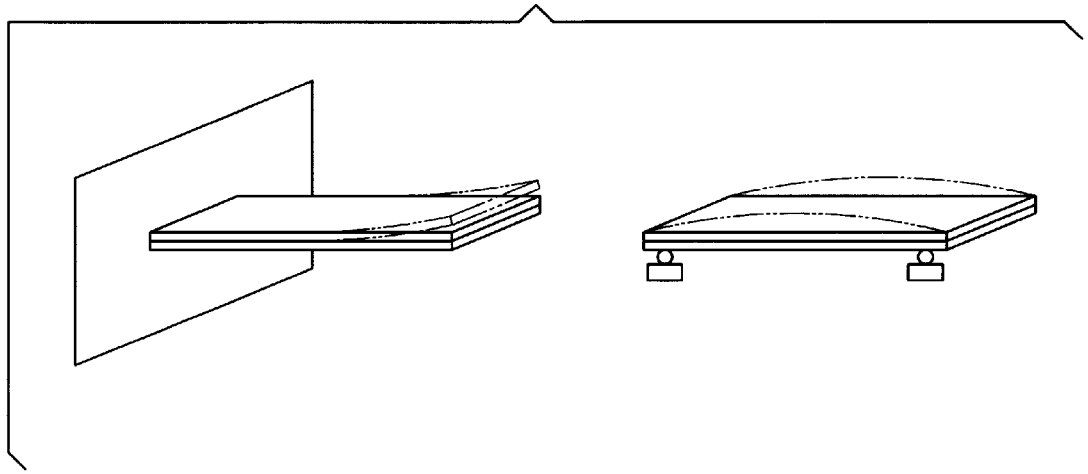
FIG. 1, shows a convention unimorph flextensional device in both cantilever (left) and simply supported (right) boundary conditions. The dotted lines show a reaction of the actuator under an electric stress. For clarity, curvature along the shorter dimension is not shown.

The present invention relates to the construction of multi-layer piezoelectric laminates including a piezoelectric ceramic (PZT) and a ceramic conductor, specifically, zinc oxide.

The present invention utilizes the versatile tape casting method disclosed by Wu et al. "Piezoelectric Ceramics with Functional Gradients: A New Application in Material Design," J. Amer. Ceram. Soc., 79, 809–12 (1996), the entire disclosure of which is expressly incorporated herein by reference. This method permits ease in scale-up and miniaturization. Once the tapes are cut to the desired size, stacked in an appropriate order, and sintered, only electrode application and poling are required to make a functioning actuator. No post-sintering steps such as cutting, polishing, bonding, or chemical reaction are required, which can be difficult with very large or very small devices.

Besides gradients in resistivity, the present invention can have a functional gradient in piezoelectric constant, and sintering induced stress as well. Functional gradients are constructed by (i) layering PZTs with different piezoelectric constants, (ii) layering PZT with zinc oxide, (iii) altering the sintering kinetics of zinc oxide with the addition of antimony (III) oxide, or (iv) a combination of all three. The functional variation that is fabricated in the green monolith is not severely altered by solid state diffusion during sintering. The control of the green body architecture is transferred to the sintered body permitting a wide spectrum of potential functional gradients. Mixing multiple powders together during the slip production can customize the functional gradients allowing different functional variations to be created. A linear type variation can be made by stacking thin tapes with varying concentration ratios of zinc oxide and PZT and by using PZTs with different piezoelectric constants. In contrast, laminating PZT tapes directly to zinc oxide tapes creates a sharp, step-like variation. The operating voltage is kept low, due to the unique electrical properties of zinc oxide. Between 10 and 200 V/mm, the resistivity of zinc oxide dramatically reduces and acts as a conductor thereafter.

The interfacial bonding of zinc oxide and PZT is coherent and circumvents the traditional difficulties associated with co-firing metal and ceramic. Adding a few weight percent of antimony (III) oxide to zinc oxide inhibits densification and grain growth. At around 500° C. to 600° C., antimony (III) oxide vaporizes and condenses on the zinc oxide particle surface and forms a non-crystalline phase. The thin film coating suppresses densification by retarding the material transport of zinc oxide. The formation of $\alpha$-$Zn_7Sb_2O_{12}$ (spinel) and $\beta$-$Zn_7Sb_2O_{12}$ grains on the grain boundaries of zinc oxide further hinders densification.

Adjusting the levels of antimony (III) oxide controls the sintering stresses and the curvature of the co-sintered ceramics. Appropriate amounts of doping can cause the zinc oxide to sinter faster or slower than the PZT layer. Control over the sintering stress permits the creation of flat laminates or significantly curved laminates. In high loading applications, dome-shaped actuators are desired due to superior mechanical support. Variation in the antimony (III) oxide level not only alters the curvatures, but also induces internal stress into the laminate and likely alters the piezoelectric constants of the PZT layer.

Processing

PZT-PZT laminates and PZT-zinc oxide laminates have been made with two different processing routes—tape casting and dry pressing. One technique of creating functional gradient samples is with tape casting. Tape casting is a very versatile processing scheme that allows the formation of material gradients across the thickness and the formation of complex shapes. However, tape casting requires the formation of non-trivial recipes that simultaneously fulfill chemical and colloidal requirements. Although less flexible than tape casting, dry pressing is useful for quick experiments with different powders and thickness ratios. Only a step function gradient is available with dry pressing by pressing two different powders together. However, due to the simplicity of the dry press method, many experiments can be achieved in a short period of time. Once the appropriate conditions are established, the tape casting method can be utilized.

PZT powders (EDO Corporation, Salt Lake City, Utah) and zinc oxide powders (Zinc Corporation of America, Monaca, Pa. and Aldrich, Milwaukee, Wis.) were used to construct the laminates. The Aldrich zinc oxide powder was used for all dry pressed samples and the Zinc Corporation of America zinc oxide was used for all tape cast samples. Neither powder worked well for both processing schemes.

Antimony (III) oxide (Aldrich, Milwaukee, Wis. and Alfa Aesar, Ward Hill, Mass.) was used to control the sintering rate of zinc oxide by doping on the order of 2 to 12 weight percent based on zinc oxide. To make flat PZT-zinc oxide laminates with the Aldrich zinc oxide powder, approximately 4 weight percent of antimony (II) oxide was needed, whereas the Zinc Corporation of America powder required approximately 8 weight percent. If less antimony (III) oxide was used, the zinc oxide portion sintered faster than the PZT and caused the laminate to become dome-shaped. Curvature in the opposite direction occurred if excess antimony (III) oxide was added to further slow the sintering rate of zinc oxide.

Dry pressing of laminate structures starts with compression of a sub-millimeter thick disc of PZT at pressures of 12 to 24 MPa. The top of the dry pressing cylinder was removed and the zinc oxide-antimony (III) oxide mixture was added. The laminate was again pressed at 12 to 24 MPa. Dry pressing two PZTs with different piezoelectric constants produces a PZT—PZT actuator.

Tape casting permits greater control of the functional gradients, because tapes thinner than 100 microns of different materials can be stacked and laminated in any fashion. Additionally, tape casting permits the use of complicated two-dimensional shapes that are difficult to achieve with dry pressing. Aqueous tape casting slips based on recipes modified from Rohm and Hass Product Data Sheet, Duramax B-1050, have been made with a variety of different PZT powders, and zinc oxide-antimony (III) oxide mixtures.

PZT suspensions were made with 15g of DI water and ammonium hydroxide at pH 10 and 111.75 g of PZT. The suspension was stirred with a magnetic stir bar for 8 to 12 hours. 4.33 g of Duramax™ B1050 (Rohm and Haas, Philadelphia, Pa.), 5 drops of Jeffamine® D-400 (Texaco, Conroe, Tex.), 1 drop of Triton™ X-405 (Union Carbide Corporation, Danbury, Conn.), 5.67 g of Duramax™ B1000 (Rohm and Haas), and 0.5 g granulated polyethylene glycol 8000 (Fisher Scientific, Pittsburgh, Pa.) were stirred in the ceramic suspensions. Stirring for 2 to 4 hours must be gentle as to avoid air bubbles in the mixture. The slurry was cast with a doctor blade on 3-mil polyester ceramic carrier film (SIP-75 from R. E. Mistler, Inc., Yardley, Pa.).

Zinc oxide-5 wt. % antimony (III) oxide suspensions were made with 25 g of DI water with 1.5 g of Darvon™ 7 (R. T. Vanderbilt Company, Inc., Norwalk, Conn.) at pH 9.7 with 144 g of zinc oxide and 7.2 g of antimony (III) oxide. Other dopant levels of antimony (III) oxide were obtained by fixing the volume of ceramic powder and adjusting the mass ratio of the ceramic powders. After being stirred with a magnetic stir bar for 8 to 12 hours the latex binder was added. 7.92 g Duramax™ B1050 (Rohm and Haas), 10 drops of Jeffamine® D-400 (Texaco), 1 drop of Triton™ X-405 (Union Carbide Corporation), 18.15 g of Duramax™ B1000 (Rohm and Haas), and 1.0 g granulated polyethylene glycol 8000 (Fisher Scientific) were added to the ceramic suspension. The mixture was slowly stirred with a magnetic stir bar for 24 hours, then cast with a doctor blade on 3-mil polyester ceramic carrier film (SIP-75).

Figure 2:
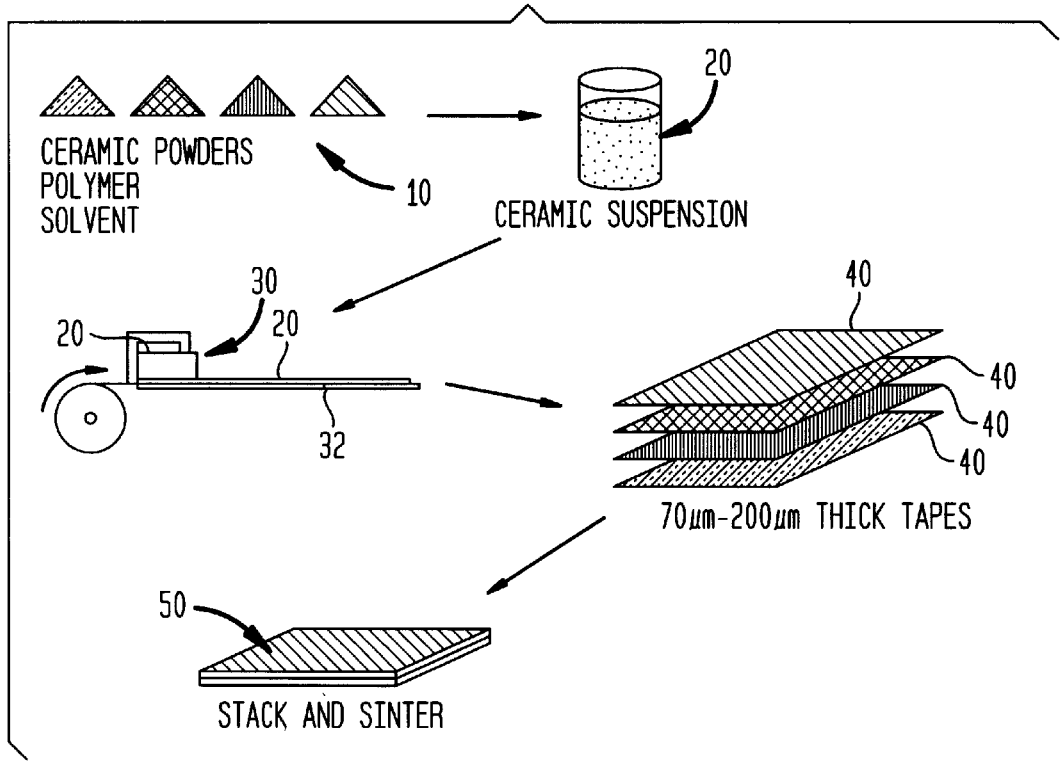
FIG. 2, is a graphical depiction of the process of making a multi-layer piezoelectric ceramic according to the present invention.

An outline of the process is shown in FIG. 2. Ceramic powders, and/or polymers and/or solvents, collectively 10, are mixed to form a ceramic suspension 20, mixed with polymers to provide the mechanical integrity needed for handling, were poured into a doctor blade assembly 30. The flat, doctor blade sweeps the liquid mixture across a substrate. Within several minutes the tape 40 was dried, cut, and separated from the substrate. The dried tapes ranged in thickness from 70 to 200 microns, depending on the slip properties and gap width of the doctor blade. Although tapes thinner than 70 microns have not be made, it is expected that this is not the lower limit. The 70 micron thick tapes were easy to handle and did not tear or deform under normal handling conditions.

Any desired shape or size could be stamped from the tape, but preliminary work used simple rectangular and circular pieces that have characteristic lengths of 1 to 5 cm. The tapes were subsequently stacked in the desired order. Heat and pressure make the stacked structure into a laminated monolith 50 by inter-diffusing the polymers across adjacent tapes. Typically, 11 MPa at 120° C. for 30 minutes in a heated hydraulic press (Preco, Los Angeles, Calif.) fully laminated samples up to a millimeter thick.

Upon removal from the warm press, the laminated monolith was placed in a covered crucible. Pressed pellets of lead oxide were arranged in the crucible to reduce lead loss of the specimen at high temperatures. The binder was removed by slowly heating to 400° C. and holding for 3 to 6 hours in flowing oxygen. After burnout, the sample was heated rapidly to 1175° C. and held for 3 to 6 hours. It was found that this sintering schedule yielded samples that were greater or equal to 98 percent of the theoretical density.

After sintering, the specimens were cleaned with acetone and electroded with silver powder epoxy (Heraeus DT1402, West Conshohocken, Pa.) on the two major surfaces. The silver epoxy was fired at 600° C. for 20 minutes. The specimens were poled at 120° C. with a 1.2 to 2.4 kV/mm electric field and aged at room temperature for at least 2 days prior to testing.

Characterization

Energy dispersive spectroscopy (EDS) was used to examine the material property gradients of sintered laminates. PZT—PZT and PZT-zinc oxide interfaces were examined. For the PZT—PZT study, an approximately 1 millimeter thick sintered laminate was cross-sectioned and polished. The sample was dry pressed with EC-70 (EDO Corporation) and EC-63 (EDO Corporation). For the PZT-zinc oxide study, an approximately 800 micron thick sintered laminate was cross-sectioned and polished. The sample was made with 4 tapes of zinc oxide doped with antimony (III) oxide co-sintered to 4 tapes of PZT EC-76 (EDO Corporation).

Figure 3:
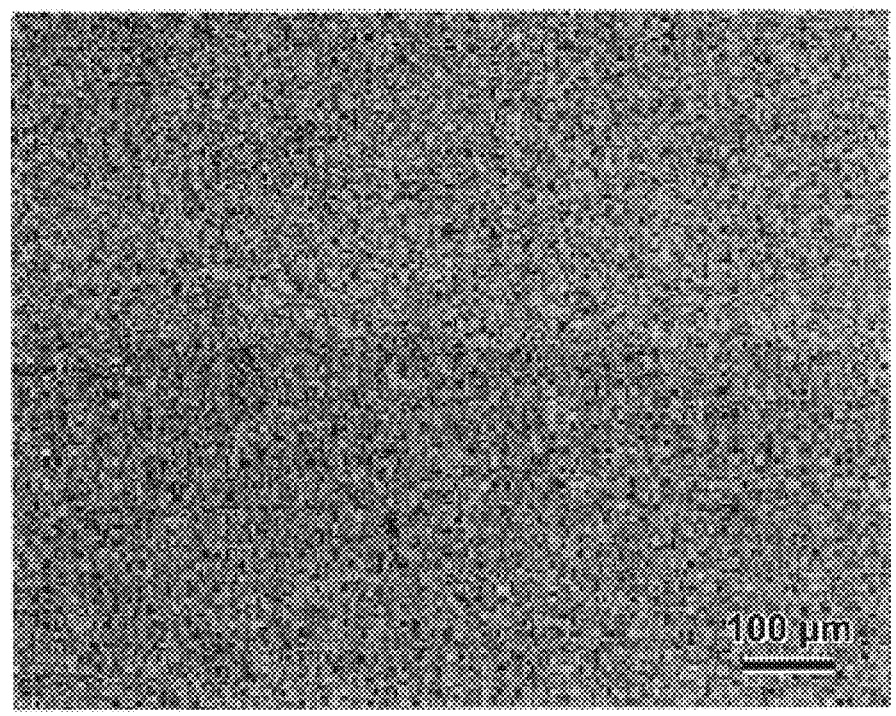
FIG. 3 is an EDS image of strontium intensity for the PCT EC-70 (top)—PZT EC-63 (bottom) interface.
Figure 4:
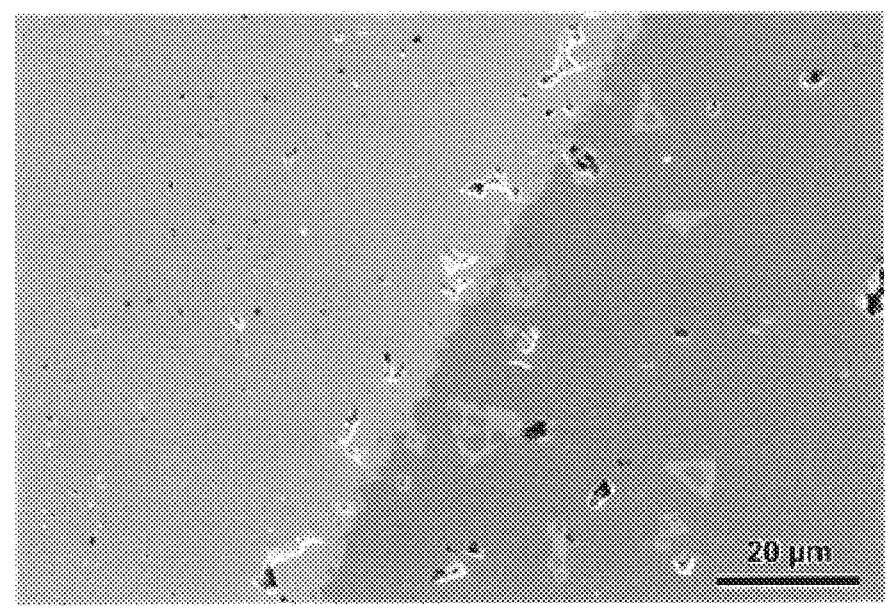
FIG. 4 is a SEM image of the PZT (upper left)—zinc oxide (lower right) interface.

FIG. 3 displays the element map of strontium for the PZT—PZT interface. For these two PZT powders, strontium concentration was the most pronounced chemical variation as observed with EDS, making it a logical choice to mark the interface location. The sharp nature of the strontium interface is evident, and it appears that no significant diffusion of strontium occurred during sintering. The PZT-zinc oxide exhibits similar characteristics. A scanning electron microscope (SEM) image of the PZT-zinc oxide interface is shown in FIG. 4. The interface between PZT and zinc oxide appears coherent and sharp without voids or any evidence of poor bonding.

Figure 5:
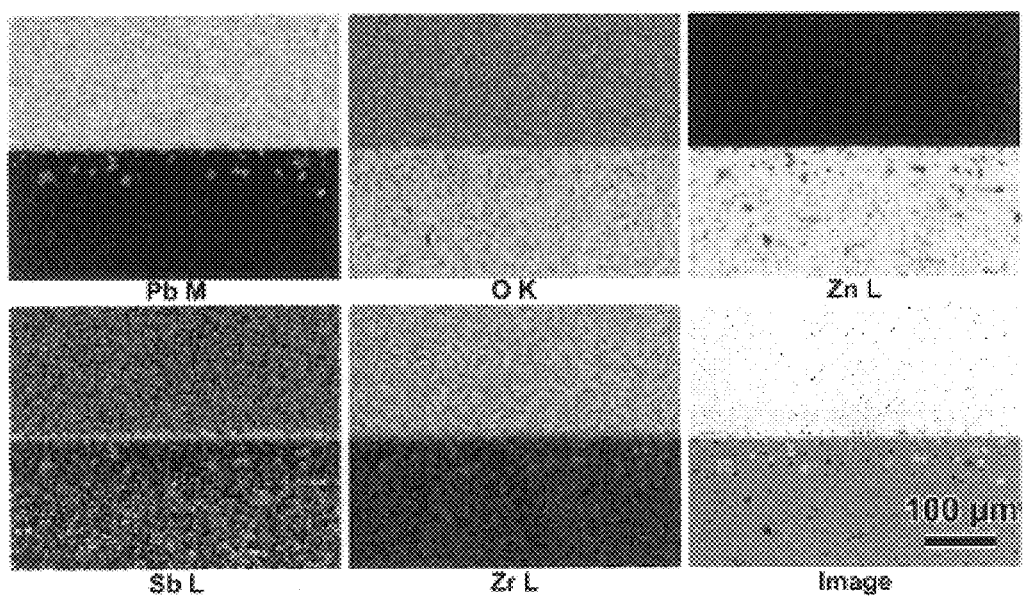
FIGS. 5 and 6 are EDS images of the PZT (upper half)—zinc oxide (lower half) interface.
Figure 6:
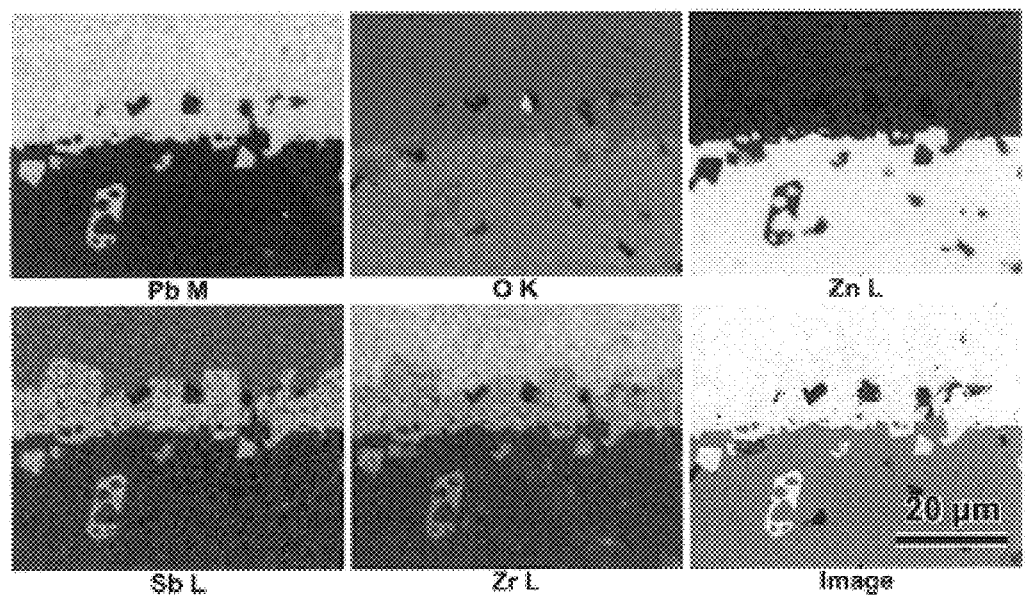

The spectra maps of five elements are examined as shown in FIG. 5 and at a higher magnification in FIG. 6. A lead (Pb), oxygen (O), antimony (Sb), zinc (Zn), and zirconium (Zr) element map is shown in each figure. The elemental mapping of zinc and oxygen clearly displays a sharp interface indicative of the starting green body. The elemental mapping of lead, antimony, and zirconium also displays a sharp interface, but shows evidence of material diffusion or migration. Pockets of lead reside some 50 microns on the zinc oxide side. Antimony has migrated from the zinc oxide side into the interface region. Additionally, it appears that antimony replaces some of the zirconium in the PZT side. Subsequently, there is an antimony-depleted zone in the neighboring zinc oxide side that is about 50 micron thick. The low melting point of antimony (IE) oxide at 656° C., makes it likely for large transport distances at the sintering temperature. Distribution of the antimony ions within the zinc oxide layer is patchy. Nucleation and growth of α and β-$Zn_7Sb_2O_{12}$ grains may account for the inhomogeneous distribution of antimony within the zinc oxide side.

Figure 7:
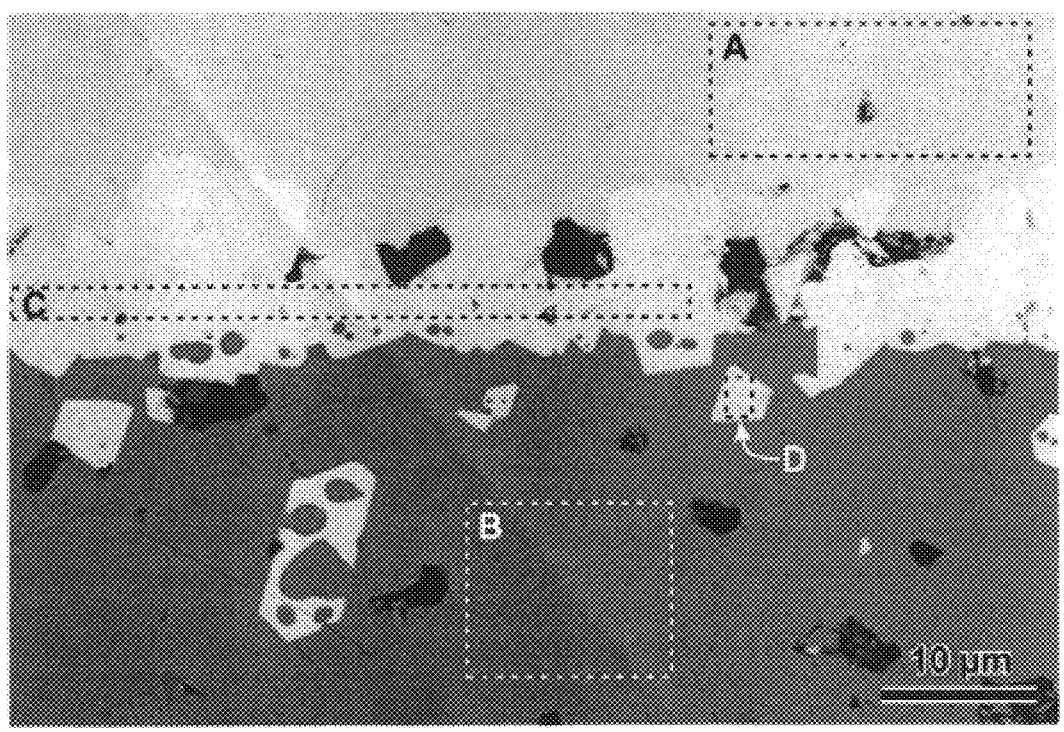
FIG. 7 is a back-scatter SEM image of the PZT (upper left)—zinc oxide (lower right) interface showing identified regions A, B, C, and D in enclosed boxes.

A quantified study of the element proportions was done for 4 areas within 20 microns of either side of the interface. The four areas are labeled in FIG. 7. Region 'A' corresponds to the area fully within the PZT region, 'B' corresponds to the area fully within the antimony-depleted zinc oxide region, 'C' corresponds to the long thin region at the interface that is rich in antimony, and 'D' corresponds to the migrated lead rich spot on the zinc oxide region. The atomic percentage of cations within each region is shown in Table 1.

The obtained atomic percentages may have some error in precision, but provide a meaningful comparison between regions of interest. Spectra overlap with titanium and oxygen will tend to introduce error into both element concentration measurements. Additionally, different lines of excitation were used for the five elements. L-lines were used for zinc, antimony, and zirconium. Whereas, M-lines were used for lead and K-lines were used for oxygen, which can cause discrepancies.

Figure 9:
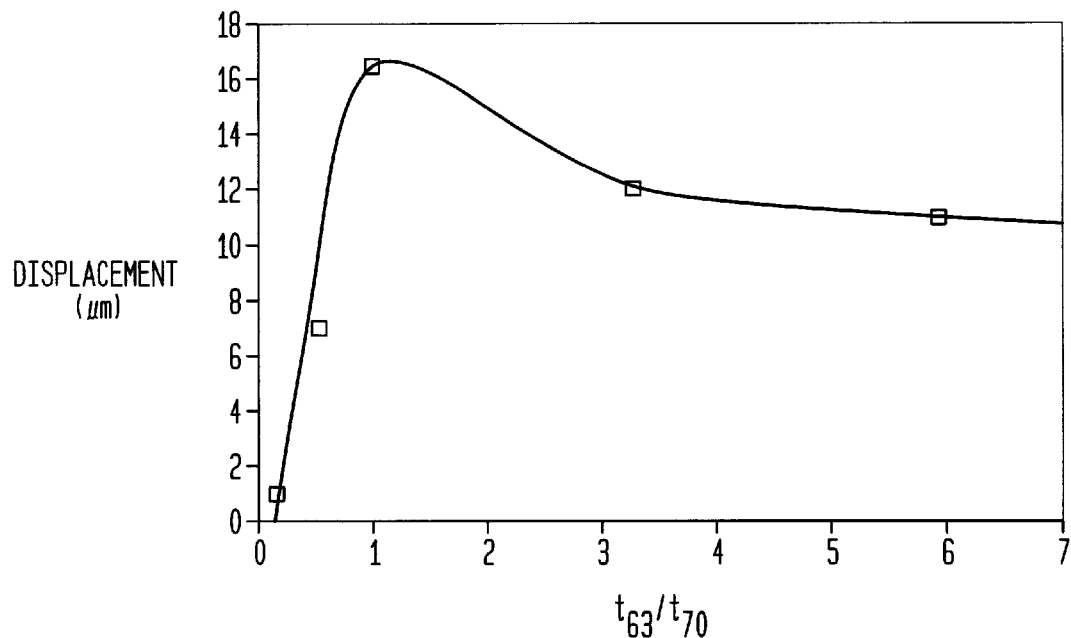
FIG. 9 is a graph of the displacement verses thickness ration for the PZT-PCT type actuator.

(Omega L500). All of these samples were discs that measure approximately 25 mm in diameter and approximately 1 mm in thickness. FIG. 9 displays the displacement verses thickness ratio for the PZT—PZT dry pressed system.

The PZT-zinc oxide samples had greater variation in actuator thickness than the PZT—PZT samples, which makes the displacement verses thickness ratio chart meaningless unless scaled appropriately. To account for varying actuator dimensions, the displacement is normalized according to the scaling law outlined by Shih et al. "Scaling Analysis for the Axial Displacement and Pressure of Flextensional Transducers," J. Amer. Ceram. Soc., 80 [5] 1073–1078 (1997), in equation (1).

$$displacement_{scaled} = \frac{displacement_{actual}}{V\left(\frac{L}{t}\right)^2} \quad (1)$$

Where V is the applied voltage across the thickness, t is the sample thickness, and L is the diameter of the disc. Table 2 displays the normalized displacement verses thickness ratio for the PZT-ZnO system.

TABLE 2

PZT-ZnO actuator displacement data

| PZT-ZnO dry-pressed with x wt. % $Sb_2O_3$ | Diameter (mm) | Thickness (mm) | $t_{ZnO}/t_{PZT}$ | Displacement at 600 V (μm) | Scaled displacement ($10^{-5}$ μm/V) |
|---|---|---|---|---|---|
| x = 4.0 | 24.3 | 1.06 | 0.46 | 32 | 10.2 |
| x = 4.0 | 24.4 | 1.00 | 0.50 | 38 | 10.7 |
| x = 4.0 | 24.3 | 1.15 | 0.63 | 31 | 11.6 |
| x = 4.0 | 24.4 | 1.12 | 0.72 | 29 | 10.2 |
| x = 4.0 | 24.3 | 1.16 | 0.80 | 28 | 10.6 |
| x = 6.0 | 24.5 | 1.14 | 0.47 | 16 | 5.77 |
| x = 6.0 | 24.4 | 1.14 | 0.55 | 17 | 6.18 |
| x = 6.0 | 24.5 | 1.12 | 0.96 | 25 | 8.71 |
| x = 6.0 | 24.0 | 1.45 | 1.50 | 13 | 7.91 |

TABLE 1

Cation Percentages

| Region | Lead | Zinc | Antimony | Zirconium | Titanium |
|---|---|---|---|---|---|
| A | 57.89 | 3.98 | 4.20 | 20.71 | 13.22 |
| B | 0.04 | 99.87 | 0.00 | 0.00 | 0.09 |
| C | 51.95 | 8.94 | 22.89 | 12.45 | 3.75 |
| D | 33.14 | 39.16 | 16.91 | 7.58 | 3.21 |

Experimental Results and Discussion

Figure 8:
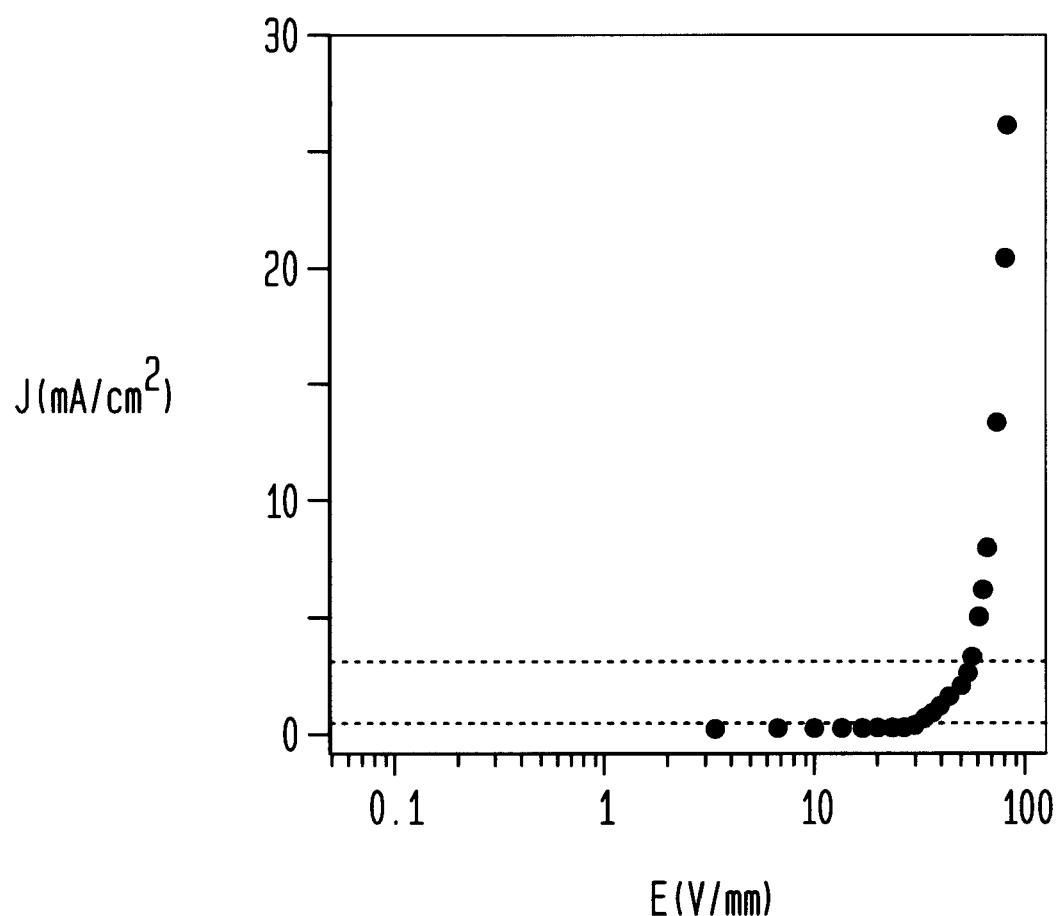
FIG. 8 is a graph of current density verses electric field for a tape cost zinc oxide monolithic layer doped with 7 weight percent antimony oxide. The dashed lines correspond to 0.3 and 3.0 $mA/cm^2$.

Current density verses electric field behavior for the zinc oxide-antimony (III) oxide composite is displayed in FIG. 8. Zinc oxide with 8-weight percent antimony (III) oxide based on the weight of zinc oxide was prepared with the tape casting recipe. The dc voltage is applied with a high voltage source (Keithley 240A) and the current is measured with a high-resolution ammeter (Keithley 196 System DDM). The non-linear voltage verses current behavior is evident for the zinc oxide monolith, yielding a threshold field between 40 and 60 V/mm.

Actuator displacement measurements versus voltage were preformed with a linear voltage displacement transducer The PZT-ZnO system with 4 weight percent antimony (III) oxide (based on weight of ZnO), obtains greater scaled displacement than that with 6 weight percent antimony (III) oxide. In other words, for identical designs, the 4 weight percent antimony (III) oxide actuators will produce larger displacements than the 6 weight percent. The greater displacement is likely due to a stress enhancement in domain switching, which in turn increases the piezoelectric constant. A similar enhancement in the piezoelectric coefficient has also been observed in the Rainbow transducer.

At 6 weight percent antimony (III) oxide doping of the zinc oxide, the sintering rate of the zinc oxide layer is reduced to nearly match the sintering rate of PZT layer. When removed from the furnace the laminates were nearly flat. Reducing the level of antimony (III) oxide, as in the 4 weight percent samples, causes the zinc oxide to sinter faster than the PZT. Samples are visually domed with the PZT on the top. The mismatch in sintering induces a tensile force on the outer surface of the PZT layer, resulting in a preferential domain orientation. This type of stress field typically causes the ferroelectric domains to align parallel to the direction of tensile force. When an electric field is applied, the domains will reorient by 90° domain switching.

Figure 10:
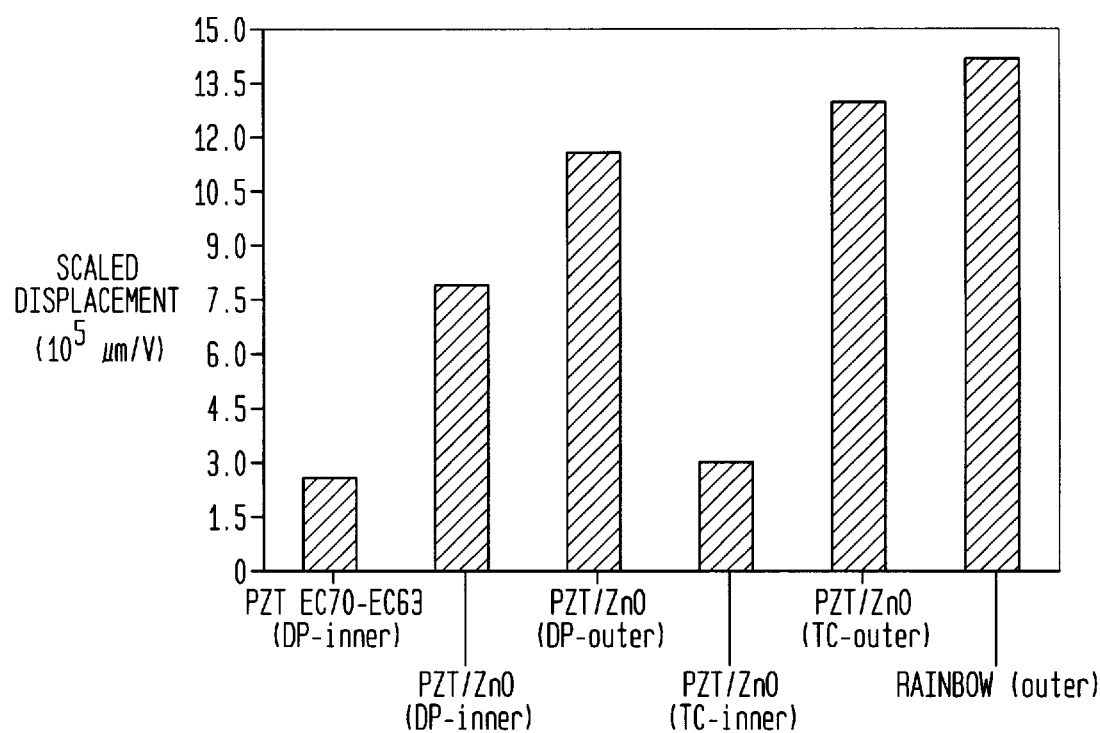
FIG. 10 is a graph of the sealed displacement for different systems according to the present invention compared with a commercially available Rainbow. DP=dry pressed, TC=tape cost.

Comparison of scaled displacement for different systems according to the present invention with commercially available Rainbows (Aura Ceramics, Minneapolis, Minn.) is shown in FIG. 10. For each of the systems the applied voltage is different. The applied voltage is 1000 V for the EC70-EC63 samples, 600 V for the dry pressed samples, 200 V for the tape cast samples, and 1000 V for the Rainbow.

Figure 11:
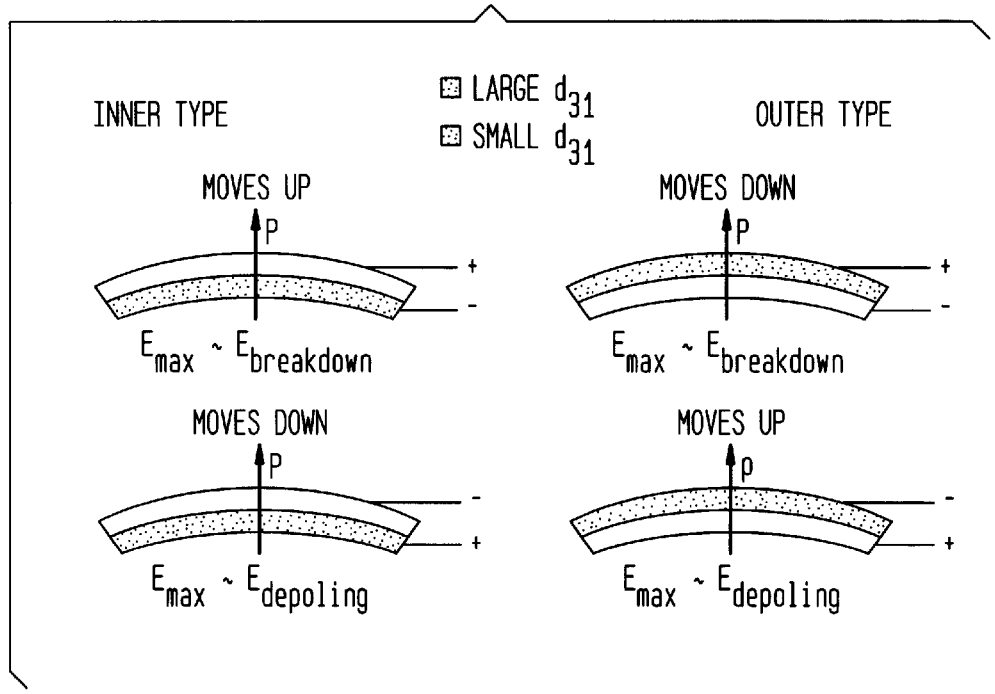
FIG. 11 shows inner and outer type curved actuators, showing the maximum allowed electric field (Emax) for each direction. $E_{breakdown}$ is the dielectric breakdown and $E_{depoling}$ the field that will depole the piezoelectric.

Dry pressed and tape cast samples of the present invention are further classified by their curvature. Each of the present invention samples possesses a dome-like structure like the Rainbow where the active piezoelectric is on the outer surface of the dome. However, the unique processing capabilities of the present invention permits placement of the active piezoelectric on either the outer or inner surface of the dome by varying the sintering rate of the zinc oxide layer. If the piezoelectric layer is on the outer surface, like the Rainbow, then it will be named outer. Likewise, if the piezoelectric layer is on the inner surface, then it will be named inner. See FIG. 11. The present invention samples that are outer types, like the Rainbow, have higher displacements than the inner types. Because the outer surface of the active piezoelectric is put in tension, the enhancement in displacement can be accounted for preferential domain alignment.

Figure 12:
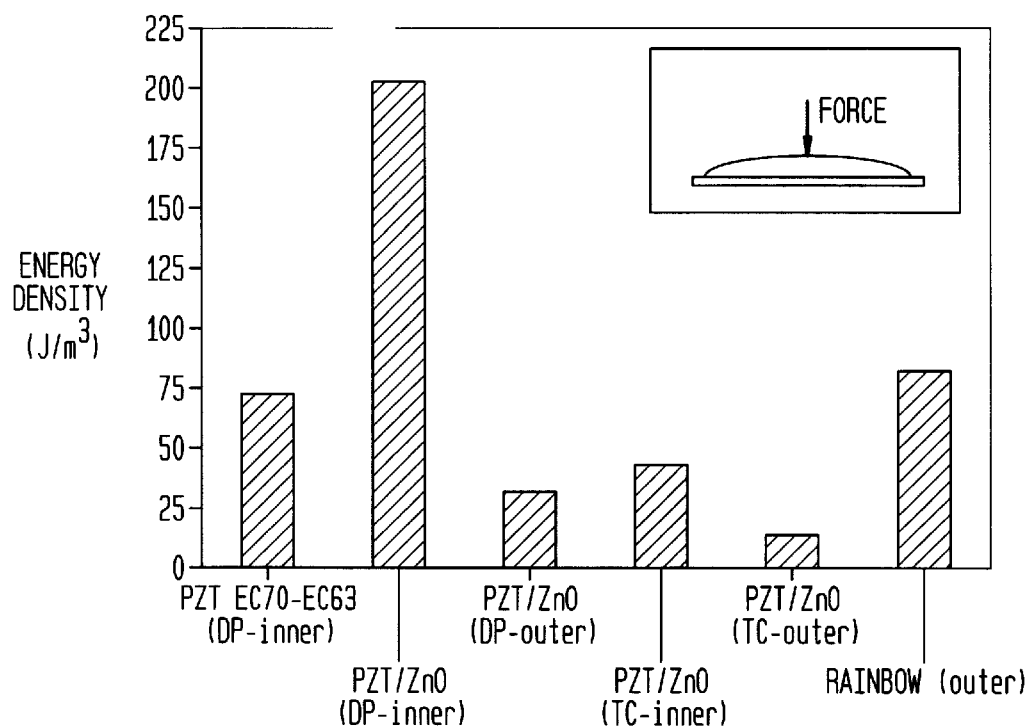
FIG. 12 is a graph of the energy density of different actuator systems. DP=dry pressed, TC=tape cast. The inset schematically displays the experimental setup.

The energy density of different actuator systems is shown in FIG. 12 and was obtained by loading the test sample. Each of the dome-shaped samples was placed on a flat surface with the outer rim being supported. The electric field was applied in the direction to make the center of the dome move upward. For the inner type actuators, the maximum field was limited by the breakdown field of the piezoelectric or the safe operating range (800 V/mm for these samples). For the outer actuators, like the Rainbow, the de-poling fields places an upper bound on the applied field. To make the transducer push upward, the applied voltage is in the opposite direction of the poling field. The de-poling field is much less than the dielectric breakdown field. For these experiments we used 300V/mm as a cut-off electric field applied opposite to the poling direction, which is near the limits of de-polarization.

The energy density is calculated by equation (2). For these experiments the force was a concentrated load applied at the center of the discs. The loads decreased the net displacement of the transducer. The experimental configuration is shown schematically in FIG. 12. The maximum load is obtained when the transducer ceases to generate any net displacement with the applied field.

$$\text{Energy Density} = \frac{\text{(displacement at zero load)(loading at zero displacement)}}{2(\text{volume of the transducer})} \quad (2)$$

FIG. 12 clearly shows the merits of being able to control the curvature of the actuator. Though the outer type actuator displays greater normalized displacement, the inner type actuator displays greater energy density. Outer type actuators are severely handicapped by the limitation of the applied electric field due to potential de-polarization.

It is interesting to note the difference in performance of the dry pressed and tape cast actuators. Though dry pressed and tape cast transducers use different zinc oxides, it is unlikely this is the only reason for the different levels in displacement and energy density. The Aldrich zinc oxide used with the dry pressed samples required less antimony (III) oxide than the Zinc Corporation of America zinc oxide to slow the sintering rate. It appears more probable that the higher antimony (III) oxide concentration is affecting the zinc oxide and PZT. And if this is the case, the antimony (III) oxide may be altering the properties chemically and/or inducing internal stress effects within the laminate.

Co-sintering piezoelectric PZT to zinc oxide has created a modification of the traditional unimorph. When electrically stressed, the electromechanical gradient within the actuator induces a flextensional strain. Actuator properties are comparable to other flextensional technologies. The versatile processing of the present invention permits ease in size scale up and scale down.

Importantly, the ceramic piezoelectric laminates of the present invention can be used in any application in which a ceramic/metal laminate has been previously used. Examples of usage include unimorphs, bimorphs, monomorphs, Rainbows, etc. Similarly, such devices, according to the present invention, can be used in any conventional application, including, but not limited to, ice detectors positioned under the out skin of an aircraft wing.

Having thus described the invention in detail, it is to be understood that the foregoing description is not intended to limit the spirit and scope thereof. What is desired to be protected by Letters Patent is set forth in the appended claims.

What is claimed is:

1. A multilayer piezoelectric ceramic laminate comprising a piezoelectric ceramic and a zinc oxide ceramic conductor.

2. The laminate of claim 1 wherein the zinc oxide ceramic conductor includes antimony (III) oxide.

3. The laminate of claim 2 for use in a device of the type including unimorphs, bimorphs, monomorphs, and Rainbows.

4. The laminate of claim 3 wherein the device is miniaturized.

5. The laminate of claim 4 wherein the device can be utilized as an ice detector.

6. A ceramic flextensional actuator comprising a piezoelectric ceramic and a zinc oxide ceramic conductor.

7. The actuator of claim 6 wherein the zinc oxide ceramic conductor includes antimony (III) oxide.

8. The actuator of claim 7 having a flat shape.

9. The actuator of claim 7 having a highly domed shape.

10. An actuator made entirely of ceramic comprising:

a piezoelectric ceramic side; and a zinc oxide conductor side.

11. The actuator of claim 10 wherein the zinc oxide ceramic conductor includes antimony (III) oxide.

12. The actuator of claim 11 for use in a device of the type including unimorphs, bimorphs, monomorphs, and Rainbows.

13. The actuator of claim 12 wherein the device is miniaturized.

14. The actuator of claim 13 wherein the device can be utilized as an ice detector.

* * * * *